United States Patent
Namerikawa et al.

(10) Patent No.: US 7,071,599 B2
(45) Date of Patent: Jul. 4, 2006

(54) LAMINATE-TYPE PIEZOELECTRIC DEVICE AND METHOD FOR MANUFACTURING THE SAME

(75) Inventors: Masahiko Namerikawa, Seto (JP); Kazuyoshi Shibata, Mizunami (JP); Masaki Iwamoto, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 230 days.

(21) Appl. No.: 10/650,488

(22) Filed: Aug. 28, 2003

(65) Prior Publication Data
US 2004/0207296 A1    Oct. 21, 2004

(30) Foreign Application Priority Data
Aug. 29, 2002 (JP) .............................. 2002-251513
Aug. 25, 2003 (JP) .............................. 2003-300228

(51) Int. Cl.
*H01L 41/083* (2006.01)
(52) U.S. Cl. ...................................... 310/366; 310/328
(58) Field of Classification Search ................ 310/328, 310/365, 366
See application file for complete search history.

(56) References Cited

U.S. PATENT DOCUMENTS 6,278,602 B1    8/2001  Haratani et al. ............ 361/303
6,417,600 B1 *  7/2002  Kitahara .................... 310/328

FOREIGN PATENT DOCUMENTS

JP    59-145583    * 8/1984
JP    2000-049033 A    2/2000

* cited by examiner

*Primary Examiner*—Thomas M. Dougherty
(74) *Attorney, Agent, or Firm*—Burr & Brown

(57) ABSTRACT

A laminate-type piezoelectric device includes: a piezoelectric layer (2); and an internal electrode layer (3) which is laminated on the piezoelectric layer (2), has a lower surface flat along a surface of the piezoelectric layer (2) and has an edge sidewall in its tip portion having an inclined surface (3A) making an acute angle with respect to the surface of the underlying piezoelectric layer (2). The piezoelectric layers (2) and the internal electrode layers (3) are alternately laminated on each other.

6 Claims, 7 Drawing Sheets

FIG.10

| ELECTRODE PASTE PARTICLE DIAMETER, MEAN (μm) | ELECTRODE PASTE BINDER, PART (wt%) | ELECTRODE PASTE SOLVENT, PART (wt%) | ELECTRODE PASTE VISCOSITY (Pa·sec) | NONFIRED CERAMIC LAYER SURFACE ROUGHNESS (Ra, μm) | ELECTRODE ANGLE (deg.) |
|---|---|---|---|---|---|
| 0.050 | 5.0 | 10 | 4200 | 0.3 | 35 |
| 4.5 | 5.0 | 10 | 50 | 0.3 | 1.7 |
| 1.5 | 5.0 | 25 | 25 | 0.3 | 1.4 |
| 1.5 | 5.0 | 4.0 | 3300 | 0.3 | 33 |
| 1.5 | 5.0 | 10 | 300 | 0.3 | 14 |
| 1.5 | 0.7 | 10 | 32 | 0.3 | 1.8 |
| 1.5 | 12 | 10 | 3100 | 0.3 | 32 |

FIG.11

| PIEZOELECTRIC / ELECTROSTRICTIVE PASTE | | NONFIRED CERAMIC LAYER SURFACE ROUGHNESS (Ra, μm) | ELECTRODE PASTE VISCOSITY (Pa·sec) | ELECTRODE ANGLE (deg.) |
|---|---|---|---|---|
| POWDER PARTICLE DIAMETER, MEDIAN (μm) | BINDER, PART (wt%) | | | |
| 0.050 | 5.0 | 0.090 | 300 | 5.0 |
| 5.2 | 5.0 | 0.60 | 300 | 31 |
| 0.50 | 31 | 0.060 | 300 | 3.0 |
| 0.50 | 0.4 | 0.70 | 300 | 33 |
| 0.50 | 5.0 | 0.10 | 300 | 6.0 |
| 0.50 | 5.0 | 0.60 | 300 | 32 |

LAMINATE-TYPE PIEZOELECTRIC DEVICE AND METHOD FOR MANUFACTURING THE SAME

CROSS-REFERENCE TO RELATED APPLICATIONS

This application is based upon and claims the benefit of priority from Japanese Patent Application No. 2002-251513 filed on Aug. 29, 2002 and No. 2003-300228 filed on Aug. 25, 2003; the entire contents of which are incorporated herein by reference.

BACKGROUND OF THE INVENTION

The present invention relates to a laminate-type piezoelectric/electrostrictive device (hereinafter referred to as a piezoelectric device) applied to an actuator or sensors of acceleration, vibration and pressure, and to a method for manufacturing the same. The laminate-type piezoelectric device includes piezoelectric/electrostrictive layers (hereinafter referred to as piezoelectric layers) and internal electrode layers (hereinafter referred to as electrode layers), which are alternately laminated on and sintered to each other.

Conventionally, the laminate-type piezoelectric device includes a plurality of ceramic sintered layers laminated on each other. This piezoelectric device includes electrodes mainly made of metal materials between the ceramic sintered layers. Regarding manufacturing of this piezoelectric device, alternately laminating ceramic green sheets and paste conductive layers on each other forms a lamination structure. The tips of the conductive layers extend alternately in directions opposite to one another. The ceramic green sheet is larger in shrinkage rate than the conductive layer. When this lamination structure is fired, the green sheets are shrunk to press both opposed surfaces of the conductive layer. This pressing deforms the tip of the electrode into a wedge shape (see Japanese Patent Laid-Open No. 3259686).

SUMMARY OF THE INVENTION

However, a difference in firing shrinkage between the green sheet and the conductive layer is utilized, and an accurate control related to a position of the electrode tip in firing is virtually difficult.

Moreover, in order to control relative firing shrinkage between the green sheet and the conductive layer, a binder content in a conductive paste is reduced and a metal powder content therein is increased. However, the reduced binder content causes deterioration of printing property, which produces nonuniform film thickness of the conductive layer or thin print. This nonuniformity or thin print causes nonuniform film thickness of the electrode after firing, changing characteristics of the piezoelectric device.

Furthermore, in order to control the relative firing shrinkage between the green sheet and the conductive layer, a high melting point metal such as Ni, Mo or W is added to the conductive paste. However, the high melting point metal tends to react with the ceramic during firing, thus deteriorating the sintered layer in electrical-property.

In addition, the difference in firing shrinkage deforms the electrode firing, causing residual stress inside a sintered body after firing. Therefore, where the piezoelectric device is applied to electronic components such as various actuators and various sensors with a deformation action, the residual stress could possibly cause inside cracks.

It is an object of the present invention to prevent delamination and interlayer peeling due to a difference in density inside a sintered body of a laminate-type piezoelectric device. It is another object of the present invention to enhance the laminate-type piezoelectric device in dimensional accuracy of electrode layers. It is still another object of the present invention to stabilize properties of the laminate-type piezoelectric device. It is further still another object of the present invention to improve the laminate-type piezoelectric device in durability.

It is further still another object of the present invention to achieve a good printing property of electrode layers and to surely control dimensions of the electrode layers in a method for manufacturing the laminate-type piezoelectric device.

According to a first aspect of the present invention, the laminate-type piezoelectric device includes a ceramic layer as printed. The piezoelectric device includes an internal electrode layer as printed which is laminated on the ceramic layer as printed, has a flat lower surface along a surface of the ceramic layer as printed and has an edge sidewall in a tip portion having an inclined surface making an acute angle with respect to the surface of the underlying ceramic layer as printed. The ceramic layers as printed and the internal electrode layers as printed are alternately laminated on each other.

Here, piezoelectricity includes not only a piezoelectric action but also an electrostrictive action.

In this aspect, the internal electrode layer as printed formed by use of a printing method is formed on the flat ceramic layer as printed formed by use of the printing method. Thus, dimensional accuracy of the internal electrode layer as printed is high. Moreover, the edge sidewall of the internal electrode layer as printed makes an acute angle with respect to the surface of the underlying ceramic layer as printed. Thus, it is possible to suppress occurrence of defects such as cracks in the ceramic layer as printed in the vicinity of the edge of the internal electrode layer as printed. Note that it is effective to set the surface roughness (Ra) of the underlying ceramic layer as printed at 0.05 to 0.5 μm. This surface roughness controls the edge sidewall of the internal electrode layer as printed to have an inclined surface making an acute angle with respect to the surface of underlying ceramic layer as printed. Moreover, this surface roughness enhances sintered strength between upper and lower ceramic layers as printed.

According to a second aspect of the present invention, a laminate-type piezoelectric device includes ceramic layers as printed and internal electrode layers as printed, which are alternately laminated on each other. The ceramic layer as printed is made of a piezoelectric material. The internal electrode layer as printed has an end portion which is formed to be gradually thinner toward an edge thereof. This end portion is approximated by use of a straight line obtained by the least-squares method. This approximate line extends from a tip of an upper side of the edge portion of the internal electrode layer as printed. The approximate line is five times longer than an average thickness of the internal electrode layer as printed. The approximate line makes an angle of 2° to 30° with respect to the surface of the ceramic layer as printed.

In this aspect, the angle made by the approximate line is set at 2° to 30°, wherein the approximate line is obtained by the least-squares method and has a length five times longer than the average thickness of the internal electrode layer as printed from the tip of the upper side of the edge portion of the internal electrode layer as printed. Thus, when the internal electrode layer as printed is driven by applying a drive voltage thereto, occurrence of cracks can be suppressed. Moreover, since the internal electrode layer as printed is formed by printing, the dimensional accuracy of the electrode can be enhanced. Note that it is effective that the surface roughness (Ra) of the underlying ceramic layer as printed is set to 0.05 μm to 0.5 μm. This surface roughness controls the angle made by the approximate line, which is obtained by the least-squares method and has the length five times longer than the average thickness of the internal electrode layer as printed from the tip of the upper side of the edge portion of the internal electrode layer as printed, to be set to 2° to 30°. Moreover, this surface roughness enhances sintered strength between the upper and lower ceramic layers as printed.

According to a third aspect of the present invention, a laminate-type piezoelectric device includes ceramic layers as printed and internal electrode layers as printed, which are alternately laminated on each other. The internal electrode layer as printed has electrode thin films which are laminated in a multistage manner so as to be gradually thinner toward an edge thereof.

In the internal electrode layer as printed according to this aspect, the electrode thin films are laminated in a multistage manner and are formed to be gradually thinner toward the edge. Thus, in the edge portion of the internal electrode layer as printed, good step coverage of a ceramic layer as printed laminated thereon is achieved. Consequently, it is possible to suppress occurrence of defects such as cracks in the ceramic layer as printed in the vicinity of the edge of the internal electrode layer as printed.

According to a fourth aspect of the present invention, a method for manufacturing a laminate-type piezoelectric device includes a first ceramic printing step of printing and forming a ceramic layer as nonfired. The manufacturing method includes an electrode printing step of by printing an electrode material paste on a surface of the ceramic layer as nonfired to form an electrode layer as nonfired on a surface of the ceramic layer as nonfired. The electrode layer as nonfired has an edge portion in which an approximate line gives an angle of 2° to 30°. The approximate line is obtained by the least-squares method and has a length five times longer than the average thickness of the internal electrode layer as printed from the tip of the upper side of the edge portion of the internal electrode layer as printed. The manufacturing step includes a second ceramic printing step of printing and forming another ceramic layer as nonfired on the ceramic layer as nonfired having the electrode layer as nonfired formed thereon. The manufacturing method includes a step of firing a lamination body formed by sequentially repeating the electrode printing step and the second ceramic printing step.

In this aspect, forming of the electrode layer as nonfired on the surface of the printed first ceramic layer as nonfired by printing an electrode material paste allows dimensions of the electrode layer as nonfired to constitute the internal electrode layer as printed to be confirmed. Moreover, the approximate line, which is obtained by the least-squares method and has a length five times longer than the average thickness from the tip of the upper side of the edge portion of the electrode layer as nonfired, is set at an angle of 2° to 30° with respect to the surface of the underlying ceramic layer as nonfired. Thus, it is possible to suppress occurrence of defects such as cracks in the ceramic layer in the vicinity of the edge of the electrode layer after firing. Moreover, the approximate line, which is obtained by the least-squares method and has a length five times longer than the average thickness from the tip of the upper side of the edge portion of the electrode layer as nonfired, is set at an angle of 2° to 30° with the surface of the underlying ceramic layer as nonfired, and drive property and durability of the piezoelectric device can be improved.

In the fourth aspect, the surface roughness (the arithmetic mean roughness: Ra) of the first and second ceramic layers as nonfired is prepared to be 0.05 μm to 0.5 μm. Thus, it is possible to enhance printing accuracy of the electrode layer as nonfired and to enhance sintered strength between the first and second ceramic layers as nonfired. In addition, setting of viscosity of the electrode material paste at 30 to 3000 Pa·sec allows the electrode layer as nonfired to be suitably patterned on the surface of the underlying ceramic layer as printed. Specifically, setting of the viscosity of the electrode material paste prevents nonuniformity of a film thickness distribution due to excessively blurred electrode material paste. Furthermore, setting of thixotropic property of the electrode material paste at 1 to 4 allows good snap-off property of a screen mask for printing while maintaining proper viscosity during printing. Moreover, when the viscosity of the electrode material paste is set at 30 to 3000 Pa·sec, a ratio of a binder in the electrode material paste is set to 1 wt % to 10 wt %. Thus, it is possible to prevent breaking of the electrode due to a thin printing. Moreover, preparing of a ratio of a solvent in the electrode material paste at 5 wt % to 20 wt % enhances dimensional accuracy of a print pattern while maintaining proper fluidity of the electrode material paste and suppresses a tendency for the screen mask to be dried. In addition, preparing of a mean particle diameter of metal particles in the electrode material paste to be 0.1 μm to 4 μm allows good printing to be performed.

Furthermore, in the fourth aspect, setting of the electrode material paste in the edge portion of the electrode layer as nonfired lower in viscosity than the intermediate portion thereof allows the edge portion of the electrode layer as nonfired to be gradually thinned toward the tip thereof.

BRIEF DESCRIPTION OF THE ACCOMPANYING DRAWINGS

FIG. 10 shows a relationship between a tip angle (referred to as an electrode angle) of an edge of a printed electrode layer and viscosity of an electrode paste; and FIG. 11 shows a relationship between the electrode angle and surface roughness of a ceramic layer as nonfired.

DETAILED DESCRIPTION OF THE PREFERRED EMBODIMENTS

Figure 1:
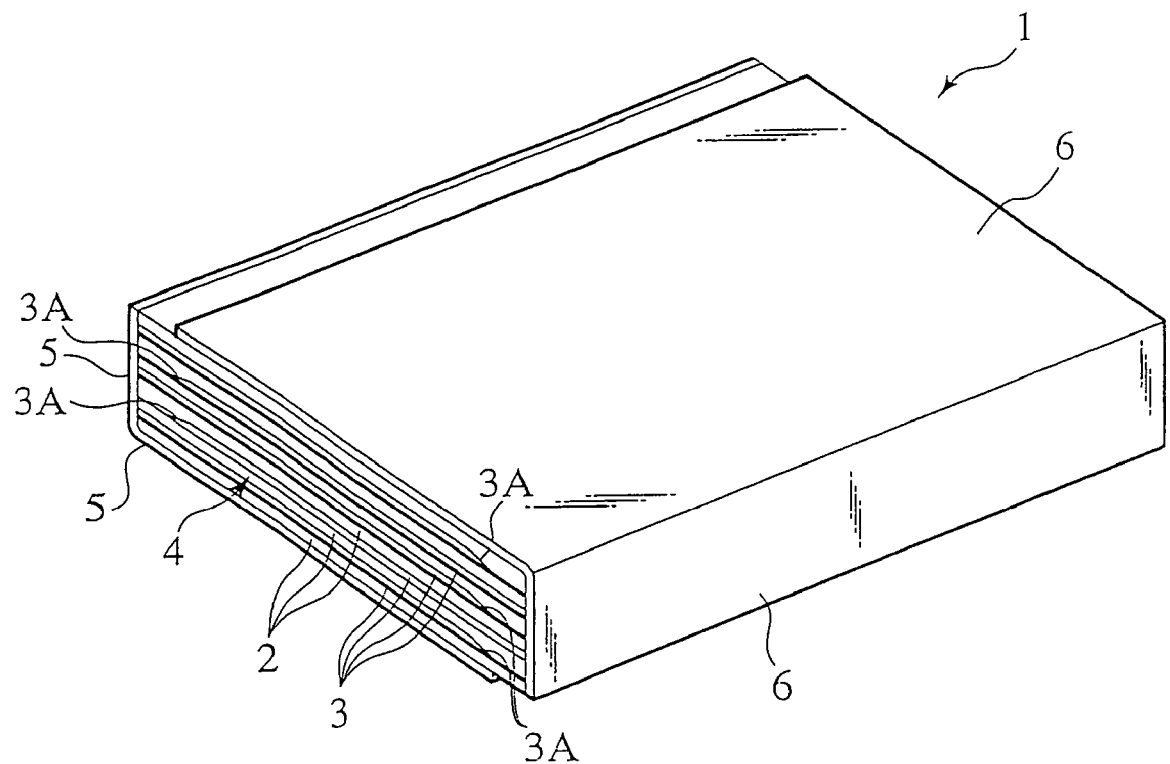
FIG. 1 is a perspective view showing a laminate-type piezoelectric device according to a first embodiment of the present invention.

Based on embodiments shown in the drawings, a laminate-type piezoelectric device and a manufacturing method thereof according to the present invention will be described below in detail. Note that the drawings are schematic ones and thicknesses of respective layers, ratios between the thicknesses and the like are different from actual ones. Moreover, parts included in the drawings have different dimensional relationships and ratios from one another between the drawings. Therefore, specific thicknesses and dimensions should be determined by taking the following description into account.

First Embodiment

Constitution of Laminate-Type Piezoelectric Vibrator

This embodiment is of a laminate-type piezoelectric/electrostrictive device (hereinafter referred to as a piezoelectric device) 1 to which the present invention is applied. As shown in FIG. 1, piezoelectric device 1 includes a lamination structure 4. The lamination structure 4 includes piezoelectric layers as printed(hereinafter referred to as piezoelectric layers) 2 as a plurality of ceramic layers as printed and internal electrode layers as printed (hereinafter referred to as electrode layers) 3, all of which are alternately laminated on each other. The piezoelectric device 1 includes a pair of external electrodes 5 and 6 extending from upper and lower surfaces of the lamination structure 4 to sides thereof. The external electrodes 5 and 6 are electrically separated from each other. On two opposed sides of lamination structure 4, external electrodes 5 and 6 are alternately and mutually connected to respective electrode layers 3.

Figure 2:
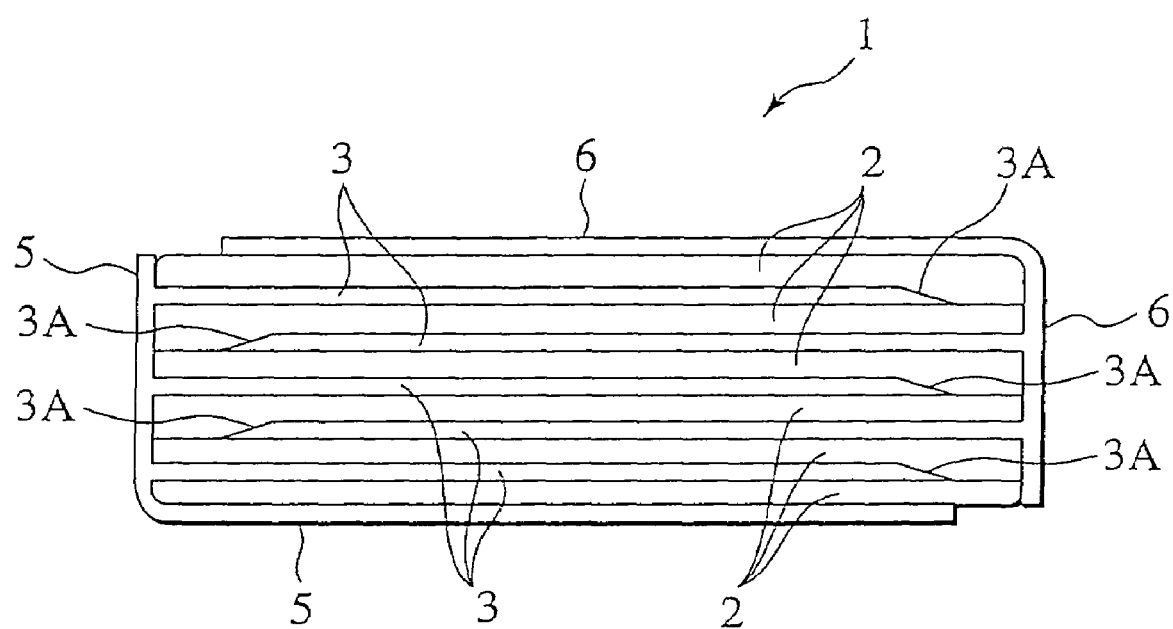
FIG. 2 is a side view showing the piezoelectric device according to the first embodiment.

Each of the electrode layers 3 is interposed between the interfaces of upper and lower piezoelectric layers 2. Electrode layers 3 vertically adjacent to each other extend in directions opposite to each other alternately from external electrodes 5 and 6, as shown in FIGS. 1 and 2. The electrode layer 3 connected to one external electrode 5 is positioned so as to be separated from the other external electrode 6. Similarly, the electrode layer 3 connected to the other external electrode 5 is positioned so as to be separated from one external electrode 6. The single-edged tip edge portion of each electrode layer 3 has an inclined surface 3A at an acute angle with respect to the surface of piezoelectric layer 2 thereunder. The piezoelectric layers 2 and electrode layers 3 are sequentially laminated on each other by use of a printing method. The piezoelectric layer 2 preferably has a surface roughness of 0.05 to 0.5 μm. The surface roughness is evaluated by use of an arithmetic mean roughness Ra according to the method of JIS B 0601.

Figure 3:
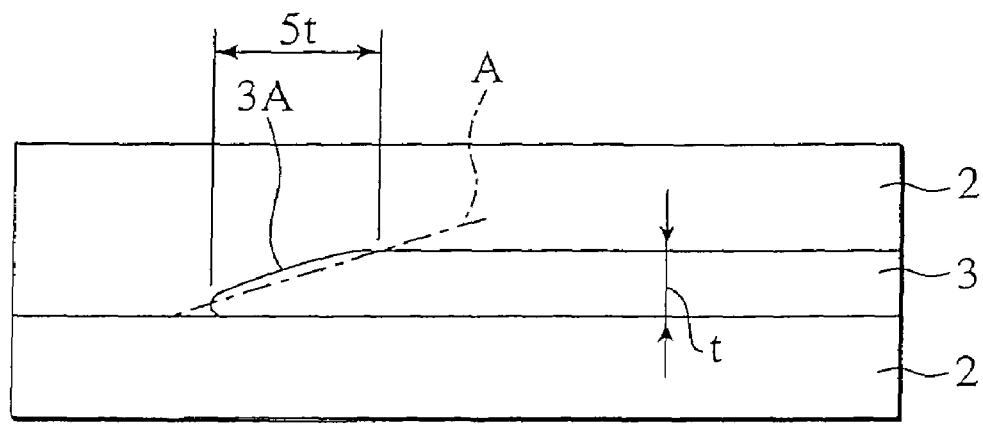
FIG. 3 is an enlarged view of a main part, showing a tip portion of an internal electrode layer and piezoelectric layers according to the first embodiment.

As shown in FIG. 3, in the tip edge portion of electrode layer 3, an angle made by a lower side (mean) of an electrode layer 3 and a straight line A (hereinafter referred to as a tip angle) is set to 2° to 30°. The straight line A is an approximate line related to inclined surface 3A, the approximate line being obtained by the least-squares method. The approximate line has a length five times longer than the average thickness from the tip of an upper side of electrode layer 3.

In the case of the tip angle of 1° or less, the piezoelectric device has an extremely low initial displacement property at a proportion of 7 to 10. When the piezoelectric vibrator including electrode layer 3 with the tip angle of 1° is driven at about 1±1 kV/mm and 1 kHz, all vibrators show displacement of 50% or less of normal products after the lapse of 100 hours. Cross-sections of polished surfaces of the piezoelectric vibrator at initial defect or after drive for 100 hours are subjected to SEM observation. In an initial defective product, it is observed that cracks are produced in a direction parallel to the electrode layer 3 in a part of piezoelectric layer 2 in the vicinity of the tip of a part of electrode layer 3. In the piezoelectric vibrator after drive for 100 hours, similar cracks are observed in parts of piezoelectric layers 2 in the vicinity of the tips of all electrode layers 3. The reason that such cracks is produced is because the tip angle is as acute as 1° or less, and stresses produced during firing shrinkage and drive are concentrated in the vicinity of the tips of electrode layers 3. Consequently, the lower limit of the tip angle is 2°. The tip angle is set to an angle larger than 2°.

Meanwhile, the tip angle has an upper limit of 30°. In other words, in the case where the tip angle is 31° or more, interlayer peeling occurs in precursors of the piezoelectric vibrators at the rate of three out of ten at the stage before firing. When the precursors of the piezoelectric vibrators, in which no interlayer peeling is produced at this stage, are subjected to firing, the interlayer peeling is produced in two of the precursors after firing. Furthermore, when displacement of the remaining five piezoelectric devices is evaluated, the displacement of all of the devices is lower than that of usual ones by about 30%. When a peeled surface of the one showing the interlayer peeling after firing is subjected to the SEM observation, a fired surface having a smooth crystal grain surface is observed in a part of piezoelectric layer 2 in the vicinity of the tip of electrode layer 3. Moreover, ahead of the fired surface, an intragranular cleavage plane and a discontinuous grain boundary surface are observed. From the observation described above, it is considered that drying shrinkage during printing and drying of piezoelectric layer 2 produces a cavity in piezoelectric layer 2, and stress due to drying shrinkage and stresses during firing and drive produce the crack from a tip of the cavity. Consequently, the tip angle is set to 30° or less.

Figure 4:
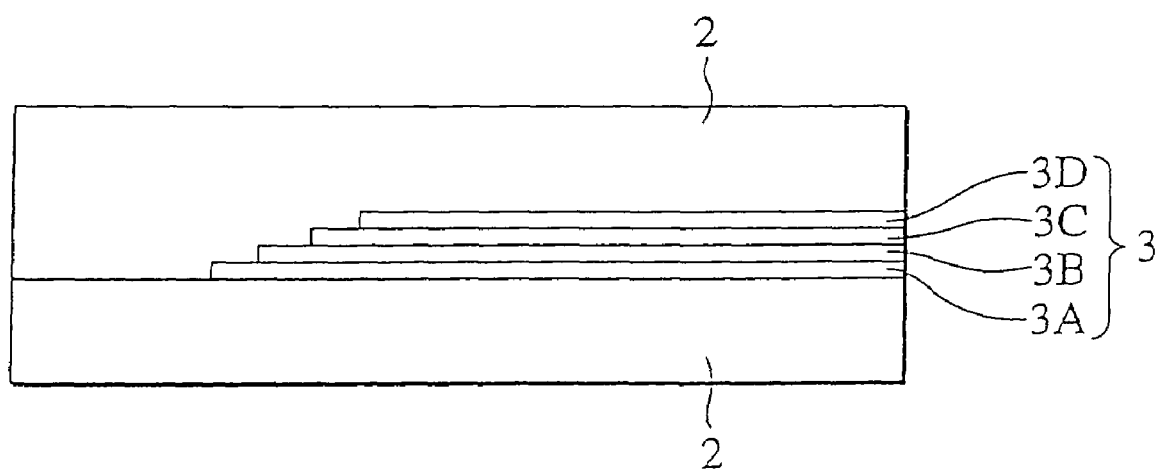
FIG. 4 is an enlarged view of a main part, showing tip portions of an internal electrode layer and piezoelectric layers according to a modified example of the first embodiment.

In this embodiment, electrode layer 3 has a single layer structure. Meanwhile, as shown in FIG. 4, electrode layer 3 may be composed of multiple layers of electrode thin films with the tip portions of the layers structured as a step in a staircase pattern. In this case, the tip angle of electrode layer 3 is also set to 2° to 30°. FIG. 4 shows the example where sequential printing of four layers of electrode thin films 3A, 3B, 3C and 3D forms electrode layer 3.

In piezoelectric device 1, the flat piezoelectric layer 2 formed by use of the printing method has electrode layer 3 formed thereon by use of a printing method. The printing method can enhance dimensional accuracy of piezoelectric layer 2 and electrode layer 3. Moreover, an edge sidewall of electrode layer 3 is set at an acute angle of 2° to 30° with a surface of piezoelectric layer 2 there below. This angle range can suppress occurrence of defects such as cracks in piezoelectric layer 2 in the vicinity of the edge of this electrode layer 3. Note that it is effective to set the surface roughness (Ra) of underlying piezoelectric layer 2 to 0.05 to 0.5 µm. This surface roughness controls the edge sidewall of electrode layer 3 to have an inclined surface at an acute angle with respect to the surface of underlying piezoelectric layer 2. Moreover, this surface roughness increases sintered strength between upper and lower ceramic layers as printed.

In this embodiment, the setting of the tip angle of the electrode layer as acute as 2° to 30° enhances tight contact between this electrode layer and the piezoelectric layers sandwiching the electrode layer with the upper and lower ones. Moreover, this embodiment has an advantage that it is not necessary to consider firing shrinkage factors of the electrode layer and the piezoelectric layer.

Second Embodiment

Figure 5:
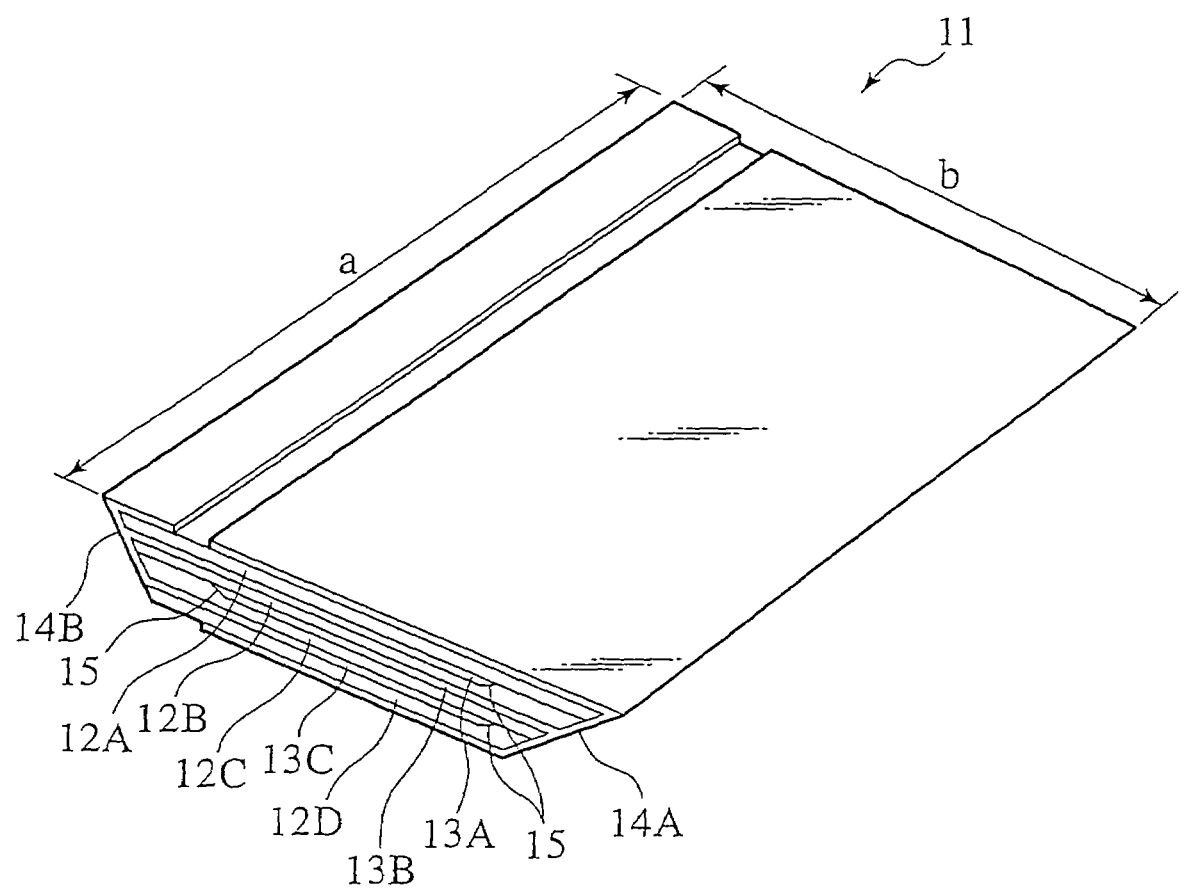
FIG. 5 is a perspective view showing a piezoelectric vibrator according to a second embodiment of the present invention.

FIG. 5 shows a laminate-type piezoelectric device 11 according to a second embodiment. The piezoelectric device 11 includes, for example, four piezoelectric layers 12A to 12D. Piezoelectric device 11 includes, for example, three electrode layers 13A to 13C interposed between adjacent layers of these piezoelectric layers 12A to 12D. The piezoelectric device 11 includes a pair of external printed electrode layers 14A and 14B (hereinafter referred to as external electrodes) to which electrode layers 13A to 13C are alternately connected. This piezoelectric device 11 has an approximately trapezoidal laminated structure having a pair of rectangular top and bottom surfaces.

Note that the second embodiment is manufactured by use of a screen printing method as described later. Thus, for the purpose of preventing short circuit being caused by print-dripping during printing of the electrode layer, the piezoelectric layers are elongated in terms of the electrode layers in direction of "a" in FIG. 5. As a result, inactive parts made of only piezoelectric materials are formed at both ends of the piezoelectric device in direction of "a" in FIG. 5.

The tip edge portions of electrode layers 13A to 13C according to the second embodiment have similar characteristics to those of the first embodiment. Each of the single-edged tip edge portions has an inclined surface 15 at an acute angle relative to a surface of each of underlying piezoelectric layers 12A to 12C as printed. Specifically, each of edge sidewalls of electrode layers 13A to 13C makes an acute angle of 2° to 30° relative to the, surface of each of underlying piezoelectric layers 12A to 12C.

These piezoelectric layers 12A to 12D and electrode layers 13A to 13C are sequentially laminated on to each other by use of a printing method. Surface roughness (arithmetic mean roughness Ra) of piezoelectric layers 12A to 12C is preferably 0.05 to 0.5 µm.

In this piezoelectric device 11, as shown in FIG. 5, widths of laminated piezoelectric layers 12A to 12D become gradually narrower toward the narrow top surface from the wide bottom surface. As a result, both sides of piezoelectric device 11 are inclined and an approximately trapezoidal lamination structure is obtained.

In this embodiment, the sum a+b of longitudinal dimension "a" and transverse dimension "b" of piezoelectric device 11 shown in FIG. 5 is set to be smaller than 10 mm. Furthermore, a thickness dimension of this piezoelectric device 11 is set to 0.3 mm or less.

Also in this piezoelectric device 11, electrode layers 13A to 13C formed by use of the printing method are formed on flat piezoelectric layers 12A to 12C formed by use of the printing method. Thus, dimensional accuracy of piezoelectric layers 12A to 12C and electrode layers 13A to 13C can be increased. Moreover, edge sidewalls of electrode layers 13A to 13C make an acute angle of 2° to 30° with the surfaces of underlying piezoelectric layers 12A to 12C. This acute angle makes it possible to suppress occur of defects such as cracks in the piezoelectric layers in the vicinity of the edges of these electrode layers 13A to 13C. Note that it is effective to set the surface roughness (Ra) of the underlying piezoelectric layers to 0.05 to 0.5 µm. This surface roughness controls the edge sidewalls of electrode layers 13A to 13C to have inclined surfaces making an acute angle with the surfaces of the underlying piezoelectric layers. Moreover, this surface roughness increases sintered strength between upper and lower piezoelectric layers 12A to 12D.

Method for Manufacturing Laminate-Type Piezoelectric Device

Next, by use of FIGS. 6 and 7, description will be given of a method for manufacturing laminate-type piezoelectric device 11 according to the second embodiment.

Figure 6:
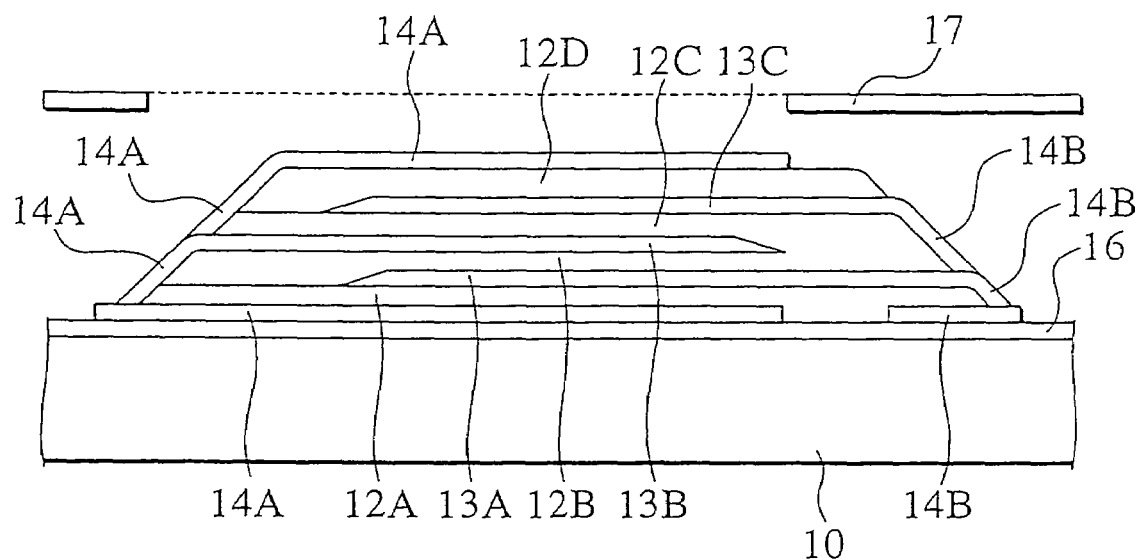
FIG. 6 is a side view showing steps of manufacturing the piezoelectric vibrator according to the second embodiment.
Figure 7:
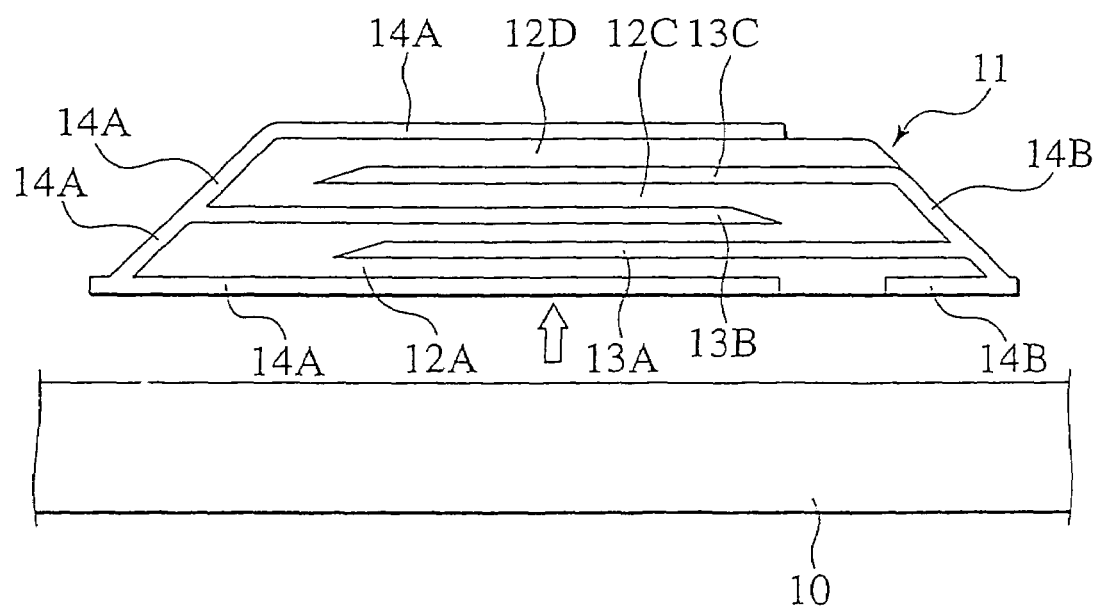
FIG. 7 is a side view showing steps of manufacturing the piezoelectric vibrator according to the second embodiment.

First, as shown in FIG. 6, substrate 10 of a predetermined size is prepared. For this substrate 10, an oxide ceramic plate made of zirconia, alumina, magnesia or the like is used. Alternatively, for substrate 10, used is a resin film, such as a polyester film, a polypropylene film, a polyphenylene sulfide film, to which a mold release agent is applied. Substrate 10 made of ceramic, functions as a base for screen printing and as a substrate for firing. Substrate 10 made of resin film, functions as the base for screen printing. During firing, it is required to peel off a dried object of a piezoelectric lamination structure formed on a resin film and to mount the object on a ceramic plate separately prepared.

In FIG. 6, the piezoelectric lamination structure is formed on ceramic substrate 10. First, printing and drying of a paste, in which carbon powder or theobromine powder is dispersed by use of the screen printing method and dried, on this substrate 10 forms a film 16 to be removed. Subsequently, the screen printing method is employed to form external electrode layers 14A and 14B on film 16 by use of a metal paste. Thereafter, the screen printing method is employed to form piezoelectric layer 12A as a ceramic layer as nonfired. This piezoelectric layer 12A is sequentially formed with electrode layer 13A, piezoelectric layer 12B, electrode layer 13B, piezoelectric layer 12C, electrode layer 13C and piezoelectric layer 12D thereon by use of the screen printing method. Last, a printing screen mask 17 as shown in FIG. 6 and the screen printing method is employed to form external electrode layer 14A.

In this manufacturing method, the inclined surfaces of the edge portions of electrode layers 13A to 13C are evaluated by use of an approximate line, which is obtained by the least-squares method and has a length five times of the average thickness from the tips of the upper sides of the edge portions of electrode layers 13A to 13C. This approximate line is set at an angle of 2° to 30° with respect to the surface of the underlying piezoelectric layer.

As a material of piezoelectric layers 12A to 12D, piezoelectric ceramics is suitable. Meanwhile, it is also possible to employ electrostrictive ceramics, ferroelectric ceramics or antiferroelectric ceramics. Specifically, enumerated is ceramics including any one of or mixture of the following substances: lead zirconate, lead titanate, lead magnesium niobate, zinc niobate, manganese niobate, antimony stannate, manganese tungstate, cobalt niobate, barium titanate, bismuth sodium titanate, bismuth neodymium titanate, potassium sodium niobate, strontium bismuth tantalate and the like. Ceramics including one of or mixture of compounds is employed. Specifically, the compounds include at least one of the following components, which are oxides or to be oxides eventually: lanthanum, calcium, strontium, molybdenum, tungsten, barium, niobium, zinc, yttrium, tantalum, lithium, bismuth, tin and the like.

As a metal material for the metal paste, single metal substances, such as aluminum, titanium, chromium, iron, cobalt, nickel, copper, zinc, niobium, molybdenum, ruthenium, palladium, rhodium, silver, tin, tantalum, tungsten, iridium, platinum, gold and lead, or alloy thereof can be employed. Furthermore, it is also possible to employ a cermet material where the identical material as the piezoelectric material dispersed into these single metal or alloy metal substances.

Thereafter, the laminate structure thus formed is fired. During firing, film 16 to be removed is removed along with firing and, as shown in FIG. 7, piezoelectric device 11 is separated from substrate 10. In such a manner, manufacturing of piezoelectric device 11 is completed.

In this embodiment, on a surface of a printed first ceramic layer as nonfired, an electrode material paste is printed to form electrode layers 13A to 13C as electrode layers as nonfired. This confirms dimensions of electrode layers 13A to 13C. The inclined surfaces 15 of electrode layers 13A to 13C are set at an angle of 2° to 30° with respect to the surfaces of underlying piezoelectric layers 12A to 12C. Moreover, the inclined surfaces 15 are evaluated by use of the approximate line, which is obtained by the least-squares method and has a length five times of the average thickness from the tips of the upper sides of the edge portions of electrode layers 13A to 13C. This suppresses the occurrence of defects such as cracks in piezoelectric layers as printed in the vicinity of the edges of electrode layers 13A to 13C after firing. The inclined surface 15 making the angle of 2° to 30° with the surface of the underlying piezoelectric layer as printed improves drive characteristics and durability of the piezoelectric device. A method for evaluating displacement of piezoelectric device 11 shown in FIG. 5 is as follows. Specifically, the fired piezoelectric device is adhered to a SUS 304 thin plate with a thickness of 50 μm by use of one-part heat cure epoxy adhesive. The piezoelectric device is connected appropriately (by soldering, wire bonding or the like). While applying a voltage to the piezoelectric device, displacement of the SUS304 thin plate in a surface vertical direction is measured by use of a laser doppler vibration velocity meter.

The surface roughness (the arithmetic mean roughness: Ra) of underlying piezoelectric layers 12A to 12C is prepared at 0.05 μm to 0.5 μm. This enhances printing accuracy of electrode layers 13A to 13C and enhances sintered strength between the piezoelectric layers as printed. Note that, with the surface roughness (Ra) under 0.05 μm the electrode layers do not obtain an anchor effect relative to the piezoelectric layers, and the electrode layers tends to be peeled off from the piezoelectric layers. Moreover, with the surface roughness (Ra) above 0.5 μm, the electrode paste is difficult to flow in a surface direction, and the tips of the electrodes are unlikely to be single-edged.

By use of an electrode material paste having viscosity of 30 to 3000 Pa·sec, the electrode layers can be suitably patterned on the surfaces of the underlying piezoelectric layers as printed. Specifically, the electrode material paste within the viscosity range can prevent blur and nonuniformity in film thickness distribution.

Furthermore, an electrode material paste having a thixotropic property of 1 to 4 (a viscosity ratio of 0.5 revolution/2.5 revolution by an E-type viscometer) allows a good snap-off property of a screen mask for printing, while maintaining a proper viscosity during printing. A thixotropic property lower than 1 hinders suitable viscosity reduction during printing, causing difficulty in snaping-off. A thixotropic property higher than 4 complicates leveling, enlarges the film thickness distribution and makes it difficult to form the single-edged shape.

In addition, preparing of a binder having a ratio of 1 to 10 wt % in the electrode material paste having the viscosity of 30 to 3000 Pa·sec prevents breaking of the electrodes due to thin printing. A binder having a ratio less than 1 wt % increases a relative amount of metal particles, causing difficulty in thinning. A binder having a ratio more than 10 wt % reduces the relative amount of metal particles, facilitating breaking of the electrodes.

Preparing of a solvent having a ratio of 5 to 20 wt % in the electrode material paste maintains suitable fluidity of the electrode material paste, thus enhancing dimensional accuracy of a print pattern and thus suppressing a tendency for the screen mask to be dried. The solvent having a ratio less than 5 wt % does not achieve suitable fluidity. Inappropriate fluidity causes printing to be difficult, and together, causes the screen mask to be easily dried, thus deterioarating repetition stability. Moreover, a solvent having a ratio more than 20 wt % reduces viscosity. Reduced viscosity causes the pattern to be blurred, thus not achieving a desired print shape.

In addition, preparing of metal particles having an average particle diameter of 0.1 to 4 μm in the electrode material paste achieves suitable printing. An average particle diameter smaller than 0.1 μm causes the thixotropic property to be too high. An average particle diameter larger than 4 μm causes thinning to be difficult and holes to be easily formed in the electrode material film after firing as well.

Furthermore, metal particles having a specific surface area of 0.5 to 5 $m^2/g$ in the electrode material paste achieve a suitable printing property. The specific surface area smaller than 0.5 $m^2/g$ causes the thixotropic property to be too high. This thixotropic property enlarges the film thickness distribution due to mesh marks of the screen mask at screen printing, facilitating breaking after firing. The specific surface area larger than 5 $m^2/g$ reduces filling density of the metal particles in the print pattern, causing holes to be formed in the electrode material film after firing. These hole portions do not function as an electrode, and a property of an electronic component thereof is deteriorated.

This embodiment has electrode layers 13A to 13C formed by use of metal pastes having a uniform viscosity. Meanwhile, setting of the viscosity of the metal pastes in the edge portions of the electrode layers lower than that in the intermediate portions thereof may gradually thin the edge portions of electrode layers 13A to 13C toward the tips thereof.

EXAMPLES 5 g of alkyl acetalated polyvinyl alcohol as a binder and 20 g of terpineol as a thinner were added to and were mixed with 100 g of piezoelectric powder having a median size of 0.5 μm for a piezoelectric paste. Moreover, a paste having viscosity of 300 Pa·sec with platinum (Pt) powder dispersed therein was employed for an electrode paste (a metal paste).

Figure 8:
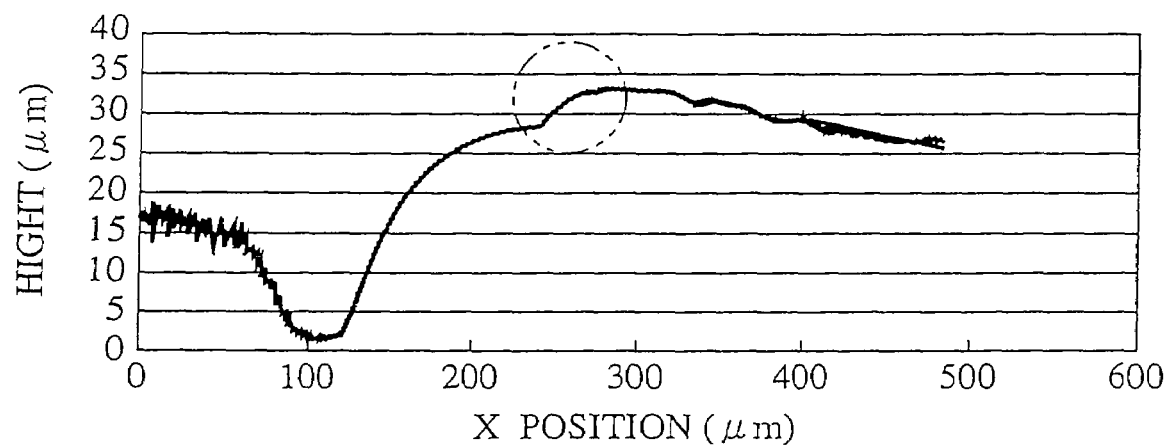
FIG. 8 is a graph according to an example of the present invention, showing results obtained by measuring, by use of a surface roughness measurement instrument, an inclined part of a tip portion of an electrode paste with respect to a piezoelectric layer in a sample obtained by printing and drying the electrode paste on a piezoelectric layer.
Figure 9:
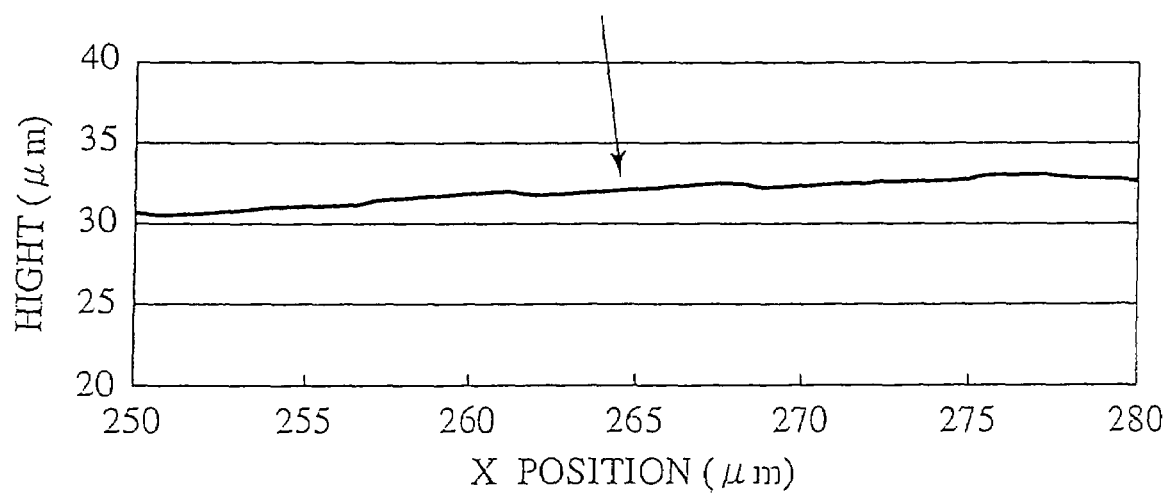
FIG. 9 is a graph showing an inclined part indicated by a double-dashed circle of FIG. 8, the inclined part being enlarged in X direction.

The piezoelectric paste was printed and dried on a zirconia plate as a substrate having film 16 to be removed formed thereon. Thereafter, the electrode paste was printed and dried on the substrate. Thus, a sample was prepared. Next, by use of this sample and a surface roughness measurement instrument (TAYLOR HOBSON Ltd.: FORM TAYLOR PLUS), a shape of an edge portion of the electrode paste printed on the piezoelectric layer was measured. According to the measurement, a sloping part as indicated by the double-dashed line circle in FIG. 8 was observed. FIG. 9 is a graph showing the sloping part surrounded by the circle in FIG. 8, the sloping part being enlarged in an X direction. From FIGS. 8 and 9, it is observed that the edge portion of the electrode paste has a single-edged shape.

Furthermore, the piezoelectric paste and the electrode paste were printed and dried for a reasonable number of times and are fired. A cross-section of a polished surface of the laminate-type piezoelectric device after firing is subjected to SEM observation. According to this observation, the electrode edge portion is slightly rounded. However, the electrode edge portion maintains a shape approximately the same as that of the printed and dried film. In this event, the angle made by the approximate line extending from the tip of the upper side of the electrode layer, which is obtained by the least-squares method and has a length five times of the average thickness, with the lower side (mean) of the electrode layer is 10°. In this event, no cracks were observed in the piezoelectric layer. Moreover, as to the piezoelectric device after a drive test, the cross-section of the polished surface was subjected to SEM observation. No cracks were observed in this cross-section.

FIG. 10 shows a relationship between the tip angle (referred to as an electrode angle) of the edge portion of the printed electrode layer and the viscosity of the electrode paste. This viscosity was prepared in terms of a mean particle diameter of platinum particles and by the number of parts of binders and the number of parts of solvents, which were included in the electrode paste. The surface roughness of the ceramic layer as nonfired was kept constant.

For the metal particles of the electrode paste, platinum (Pt) was employed. For the binder of the electrode paste, ethyl cellulose resin was employed. For the solvent of the electrode paste, terpineol was employed. For the ceramic, lead zirconate titanate (PZT piezoelectric ceramics, $PbTiO_3$—$PbZrO_3$) was employed.

FIG. 11 shows a relationship between the electrode angle and the surface roughness of the ceramic layer as nonfired. This surface roughness was prepared in terms of a median diameter of the piezoelectric ceramic and by the number of parts of binders, which were included in the piezoelectric paste. The viscosity of the electrode paste was made constant.

For the metal of the electrode paste and piezoelectric/electrostrictive ceramics, one similar to that of FIG. 10 was employed. For the binder, polyvinyl butyral resin was employed.

The number of parts of binders and the number of parts of solvents were evaluated by use of a weight ratio of the binder or the solvent to the total weight of the respective pastes.

The mean particle diameter and the median diameter were measured by use of the laser diffraction/scattering particle size distribution measurement device (LA-700) manufactured by HORIBA, Ltd.

The surface roughness is measured by use of the method according to JIS B 0601 and evaluated by use of the arithmetic mean roughness Ra.

The viscosity was measured at 2.5 revolution by use of the E-type viscometer.

As is evident from FIG. 10, when a viscosity of the electrode paste is 30 to 3000 Pa·sec, the angle of the electrode tip is within the range of about 1° to 30°.

Moreover, from FIG. 10, it can be understood that it is preferable to prepare the ratio of the binder in the electrode paste to 1.0 to 10 wt %.

Furthermore, it can be understood that it is preferable to prepare the mean particle diameter (a powder median size) of the metal particles in the electrode paste to 0.1 to 4.0 μm.

Note that the specific surface area of the metal particles in the electrode paste is preferably 0.5 to 5 m²/g. In addition, the thixotropic property of the electrode paste is preferably 1 to 4. Furthermore, the ratio of the solvent in the electrode paste is preferably modified to 5 to 20 wt %.

Meanwhile, with reference to FIG. 11, when the surface roughness of the ceramic layer as nonfired is 0.05 to 0.5 μm, the angle of the electrode tip is within the range of 1° to 30°. In this event, the number of parts of binders is preferably within the range of 5.0 to 30 wt %.

Embodiments and examples in which the present invention is applied to the laminate-type piezoelectric device have been described above. However, it should be understood that the present invention is not limited by the description and drawings included in a part of disclosure of the embodiments. Various alternative embodiments, examples and operation technologies will become apparent to those skilled in the art from this disclosure.

For example, in the embodiments, the description was given of the piezoelectric device as a laminate-type ceramic electronic component by applying the present invention thereto. However, it is needless to say that the present invention can be applied to other various laminate-type ceramic electronic components such as a laminated capacitor, a laminated inductor and a laminated varistor.

Moreover, in the embodiments, the number of the piezoelectric layers and the number of the electrode layers can be changed appropriately.

According to a first aspect of the present invention, an internal electrode layer as printed formed by use of a printing method is formed on a flat ceramic layer as printed formed by use of the printing method. Thus, dimensional accuracy of the ceramic layer as printed and the internal electrode layer as printed is high. Moreover, an edge sidewall of the internal electrode layer as printed makes an acute angle with respect to a surface of the underlying ceramic layer as printed. Thus, it is possible to suppress occurrence of defects such as cracks in the ceramic layer as printed in the vicinity of the edge of the internal electrode layer as printed.

According to a second aspect of the present invention, when a drive voltage is applied to the internal electrode layer as printed, occurrence of cracks can be suppressed. Moreover, the forming of the internal electrode layer as printed by printing enhances dimensional accuracy of electrodes.

According to a third aspect of the present invention, good step coverage of the ceramic layer as printed laminated on the internal electrode layer as printed is achieved in the edge portion of the internal electrode layer as printed. Thus, it is possible to suppress occurrence of defects such as cracks in the ceramic layer as printed in the vicinity of the edge of the internal electrode layer as printed.

According to a fourth aspect of the present invention, on a surface of a printed first ceramic layer as nonfired, an electrode layer as nonfired is formed by printing an electrode material paste thereon. Thus, dimensions of the electrode layer as nonfired to be an internal electrode can be confirmed.

What is claimed is:
1. A laminate-type piezoelectric device comprising:
   at least two ceramic layers as printed; and
   an internal electrode layer as printed which is laminated on one of the ceramic layers as printed, having a lower surface flat along a surface of said one of the ceramic layers as printed, and having an edge sidewall in a tip portion having an inclined surface making an acute angle with respect to the surface of said one of the ceramic layers as printed,
wherein the ceramic layers as printed and the internal electrode layer as printed are alternately laminated on each other.

2. A laminate-type piezoelectric device comprising:
ceramic layers as printed and internal electrode layers as printed, alternately laminated on each other,
wherein the ceramic layer as printed is made of a piezoelectric material, the internal electrode layer as printed has an end portion formed to be gradually thinner toward an edge thereof and an approximate line makes an angle of 2° to 30° with respect to a surface of the ceramic layer as printed, the approximate line being five times a length of an average thickness of the internal electrode layer as printed from a tip of an upper side of the edge portion of the internal electrode layer as printed and being obtained by the least-squares method.

3. The laminate-type piezoelectric device according to claim 1, wherein the ceramic layer as printed has surface roughness (arithmetic mean roughness Ra) of 0.05 μm to 0.5 μm.

4. The laminate-type piezoelectric device according to claim 2, wherein the ceramic layer as printed has surface roughness (arithmetic mean roughness Ra) of 0.05 μm to 0.5 μm.

5. A laminate-type piezoelectric device comprising:
ceramic layers as printed and internal electrode layers as printed, alternately laminated on each other,
wherein the internal electrode layer as printed has electrode thin films laminated in a multistage manner so as to be gradually thinner toward an edge thereof.

6. The laminate-type piezoelectric device according to claim 1, wherein adjacent ceramic layers extend beyond the tip portion of each respective internal electrode layer.

* * * * *